(12) United States Patent
Tsukuda

(10) Patent No.: US 6,696,895 B2
(45) Date of Patent: Feb. 24, 2004

(54) PUSH-PULL AMPLIFIER

(75) Inventor: Kazuaki Tsukuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1 day.

(21) Appl. No.: 10/132,168

(22) Filed: Apr. 26, 2002

(65) Prior Publication Data

US 2003/0090324 A1 May 15, 2003

(30) Foreign Application Priority Data

Nov. 7, 2001 (JP) ........................................ 2001-342084

(51) Int. Cl.⁷ ................................................ H03F 3/26
(52) U.S. Cl. ...................................... 330/264; 330/269
(58) Field of Search ................................. 330/264, 269

(56) References Cited

U.S. PATENT DOCUMENTS 5,148,120 A * 9/1992 Kano et al. ................. 330/264
5,334,950 A * 8/1994 Arimoto ..................... 330/264
5,825,228 A * 10/1998 Gross ......................... 327/333

* cited by examiner

*Primary Examiner*—Khanh Van Nguyen
(74) *Attorney, Agent, or Firm*—Arent Fox Kintner Plotkin & Kahn

(57) ABSTRACT

A source follower circuit receives, at its gate, an input signal and outputs an input current that is in accordance with the input signal. A current transfer circuit maintains constant the sum of the input current and an output current that is to be applied to a first node. A push-pull circuit includes a first transistor that directly receives, at its gate, the input signal and a second transistor having its gate connected to the first node. The voltage gain of the source follower circuit that receives the input signal is equal to or less than 1, so that the gain of the gate voltage of the second transistor to the input signal can be reduced. The difference in voltage gain between the first and second transistors can be reduced, so that it is possible to easily design a push-pull amplifier with a stable operation.

2 Claims, 2 Drawing Sheets

PUSH-PULL AMPLIFIER

BACKGROUND OF THE INVENTION

1. Field of the Invention

The present invention relates to a push-pull amplifier that is provided in an IC or the like that is formed through a CMOS process.

2. Description of the Related Art

FIG. 1 shows a conventional single-input, single-output push-pull amplifier, which may be used as the output stage of an operational amplifier. In such a case, it is desirable that the output of a differential amplifier utilizing n-channel transistors as its inputs be used as the input of the push-pull amplifier.

The push-pull amplifier includes p-channel MOSFETs 21 and 25 (which will be referred to simply as pMOSes 21 and 25 hereinafter); n-channel MOSFETs 22, 23, 24, and 26 (which will be referred to simply as nMOSes 22, 23, 24, and 26 hereinafter); a constant-current source 27; a phase compensation capacitor 28; an input terminal IN for receiving an input signal Vin; and an output terminal OUT for outputting an output signal. The input signal Vin is directly supplied to the pMOSes 21 and 25 and to the nMOS 23. The pMOS 25 and nMOS 26 constitute a push-pull circuit (the output stage).

The pMOS 21 has its gate, source and drain electrodes connected to the input terminal IN, a power supply line VDD and a node ND21, respectively. The gate electrode, source electrode and drain electrode will be referred to simply as gate, source and drain, respectively, hereinafter. The nMOS 22 has its gate and drain both connected to the node ND21 and has its source connected to a ground line VSS. The nMOS 23 has its gate, source and drain connected to the input terminal IN, a node ND22 and a node ND23, respectively. The nMOS 24 has its gate, source and drain connected to the node ND21, the ground line VSS and the node ND22, respectively. The pMOS 25 has its gate, source and drain connected to the input terminal IN, the power supply line VDD and the output terminal OUT, respectively. The nMOS 26 has its gate, source and drain connected to the node ND22, the ground line VSS and the output terminal OUT, respectively. The current source 27 supplies a constant current I27 to the node ND23. The capacitor 28 is inserted between the input terminal IN and the output terminal OUT.

In the output stage of the push-pull amplifier shown in FIG. 1, the gate of the pMOS 25 directly receives the input signal Vin. Thus, the voltage gain of the gate voltage of the pMOS 25 to the input signal Vin is "1". Meanwhile, the gate of the nMOS 26 receives the input signal Vin via the pMOS 21, nMOS 23 and current mirror circuit (the nMOSes 22 and 24). Thus, the voltage gain of the gate voltage of the nMOS 26 to the input signal Vin is not equal to the voltage gain of the gate voltage of the pMOS 25.

The voltage gain dVn/dVin of the gate voltage of the nMOS 26 to the input signal Vin will be obtained below. It is now assumed here that the transfer conductance and drain-to-source resistance of the pMOS 21 are gm2, and Rds21, respectively; the transfer conductance and drain-to-source resistance of the nMOS 22 are gm22 and Rds22, respectively; the transfer conductance and drain-to-source resistance of the nMOS 23 are gm23 and Rds23, respectively; and that the transfer conductance and drain-to-source resistance of the nMOS 24 are gm24 and Rds24, respectively. It is also assumed here that the voltage between the drain of the nMOS 23 and the ground (the voltage at the node ND22) is V23; the gate-to-source voltage of the nMOS 24 is Vx; the gate-to-source voltage of the nMOS 26 is Vn; and that the internal resistance of the constant-current source 27 is Rds27.

The above parameters establish the following equations (1), (2), and (3).

$$gm21(VDD - Vin) + \frac{VDD - Vx}{Rds21} = gm22 * Vx + \frac{Vx}{Rds22} \tag{1}$$

$$I27 + \frac{VDD - V23}{Rds27} = gm23(Vin - Vn) + \frac{V23 - Vn}{Rds23} \tag{2}$$

$$I27 + \frac{VDD - V23}{Rds27} = gm24 \cdot Vx + \frac{Vn}{Rds24} \tag{3}$$

From the above equations (1) through (3), the voltage gain dVn/dVin of the gate voltage Vn of the nMOS 26 to the input signal Vin can be expressed by the following equation (4).

$$\frac{dVn}{dVin} = \frac{gm23 - 2gm24 \cdot \frac{-gm21}{\frac{1}{Rds21} + \frac{1}{Rds22} + gm22}}{\frac{1}{Rds23} + \frac{2}{Rds24} + gm23} \tag{4}$$

$$= \frac{gm23(Rds21 + Rds22 + gm22 \cdot Rds21 \cdot Rds22)Rds23 \cdot Rds24 + 2gm21 \cdot gm24 \cdot Rds21 \cdot Rds22 \cdot Rds23 \cdot Rds24}{(Rds21 + Rds22 + gm22 \cdot Rds21 \cdot Rds22)(Rds24 + 2Rds23 + gm23 \cdot Rds23 \cdot Rds24)}$$

Since gm·Rds is, in general, much greater than 1 (i.e., gm·Rds>>1), the following equation (5) can be figured out by approximating the equation (4).

$$\frac{dVn}{dVin} = 2\frac{gm21 \cdot gm24}{gm22 \cdot gm23} + 1 \tag{5}$$

Moreover, when gm22 and gm24 of the nMOSes 22 and 24, respectively, constituting the current mirror circuit are equal to each other, the voltage gain dVn/dVin can be obtained by the following equation (6).

$$\frac{dVn}{dVin} = 2\frac{gm21}{gm23} + 1 \tag{6}$$

There may be a case when the gate voltage Vn of the nMOS 26 in the output stage has a value that is slightly greater than the threshold voltage of the nMOS 26. In such a case, it is necessary to adjust various values so that the voltage difference (Vin−Vn) between the voltage of the input signal (Vin) and the gate voltage of the nMOS 26 (Vn), that is, the gate-to-source voltage of the nMOS 23, can be large. Thus, it is necessary to make adjustments so that the threshold voltage of the nMOS 23 is higher, or so that the gain coefficient β of the nMOS 23 is smaller, by elongating the gate length of the nMOS 23, for example. As a result of this, gm23 becomes smaller. As shown in the equation (6), when gm23 becomes smaller, the voltage gain dVn/dVin becomes larger.

Therefore, in the push-pull amplifier shown in FIG. 1, the difference between the gain at the pMOS 25 (=1) and the gain at the nMOS 26 (=2·(gm21/gm23)+1, as shown in the equation (6)) in the output stage with respect to the input signal disadvantageously becomes larger. Consequently, since the gain varies between when the pMOS 25 mainly operates to output a current to the output terminal OUT and when the nMOS 26 mainly operates to input a current from the output terminal OUT, it is difficult to design a push-pull amplifier with a stable operation.

Moreover, for example, since the gain of the path on the n-channel transistor side becomes larger, the gain of the whole operational amplifier, using in its output stage the push-pull amplifier, becomes larger. Consequently, the capacitance value of the phase compensation capacitor 28 disadvantageously becomes larger. In a typical CMOS process, a gate insulator film is utilized to form a capacitor. For this reason, an increase in the capacitance value disadvantageously leads to an increase in the layout area of a push-pull amplifier and hence to an increase in the layout area of an operational amplifier using in its output stage the push-pull amplifier.

SUMMARY OF THE INVENTION

It is an object of the present invention to provide a push-pull amplifier with stable operation by reducing the difference between the gains at the respective push-pull transistors in the output stage of the push-pull amplifier with respect to the input signal.

In a form of the push-pull amplifier according to the present invention, a source follower circuit receives, at its gate, an input signal and outputs an input current that corresponds to the input signal. A current transfer circuit receives the input current and maintains constant the sum of the input current and an output current that is to be applied to a first node. A push-pull circuit includes a first transistor that directly receives, at its gate, the input signal and a second transistor having its gate connected to the first node. The push-pull circuit is responsive to the input signal to alternately activate the first and second transistors, thereby outputting output signals.

In this push-pull amplifier, the voltage gain of the source follower circuit that receives the input signal is equal to or less than 1. Thus, the gain of the gate voltage of the second transistor to the input signal can be reduced. Since the difference between the voltage gains at the first and second transistors can be reduced, it is possible to easily design a push-pull amplifier with a stable operation.

Moreover, in a case when the push-pull amplifier is used in the output stage of an operational amplifier, it is possible to reduce the gain of a circuit that transfers the output of the differential amplifier to the output stage. For this reason, the capacitance value of a phase compensation capacitor inserted between the input and output terminals can be reduced. As a result, the layout areas (chip areas) of the push-pull amplifier and operational amplifier can be reduced, resulting in a reduction in manufacturing cost. In addition, since the gain in the high frequency range increases, it is possible to provide amplification in a wider frequency band.

In another form of the push-pull amplifier according to the present invention, the current transfer circuit includes a first current mirror circuit, a second current mirror circuit and a constant-current source that supplies a constant current to a second node. The first current mirror circuit includes a first input transistor whose drain and gate are supplied with the input current, and a first output transistor that has its drain connected to the second node and that generates a first output current with the same value as the input current. The second current mirror circuit includes a second input transistor that has its drain and gate connected to the second node and that generates a second input current, and a second output transistor that has its drain connected to the first node and that supplies the first node with the output current with the same value as the second input current.

In the first current mirror circuit, the drain current flowing through the first input transistor (the input current) has the same value as the drain current flowing through the first output transistor (the first output current). In the second current mirror circuit, the drain current flowing through the second input transistor (the second input current) has the same value as the drain current flowing through the second output transistor (the second output current).

Both the drain of the first output transistor of the first current mirror circuit and the drain of the second input transistor of the second current mirror circuit are connected to the second node. For this reason, the sum of the first output current flowing through the first output transistor and the second input current flowing through the second input transistor is maintained at a constant value by the constant-current source. Therefore, as the first output current (=the input current) becomes greater, the second input current (=the second output current to be supplied to the first node) becomes smaller. Conversely, as the first output current (=the input current) becomes smaller, the second input current (=the second output current) becomes greater. In this way, merely connecting the two current mirror circuits in parallel can easily configure a current transfer circuit whose input and output currents sum into a constant value.

In yet another form of the push-pull amplifier, according to the present invention, a load transistor is disposed between the output of the source follower circuit and the input of the current transfer circuit and has its gate connected to a constant-voltage source. Since the gate of the load transistor is directly connected to the constant-voltage source, the gate-to-source voltage thereof is constant. The load transistor, therefore, always operates in the saturation region, and can prevent any deviation in the power supply voltage supplied to the source follower circuit from affecting the first current mirror circuit.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

An embodiment of the present invention will be described below with reference to the drawings.

Figure 1:
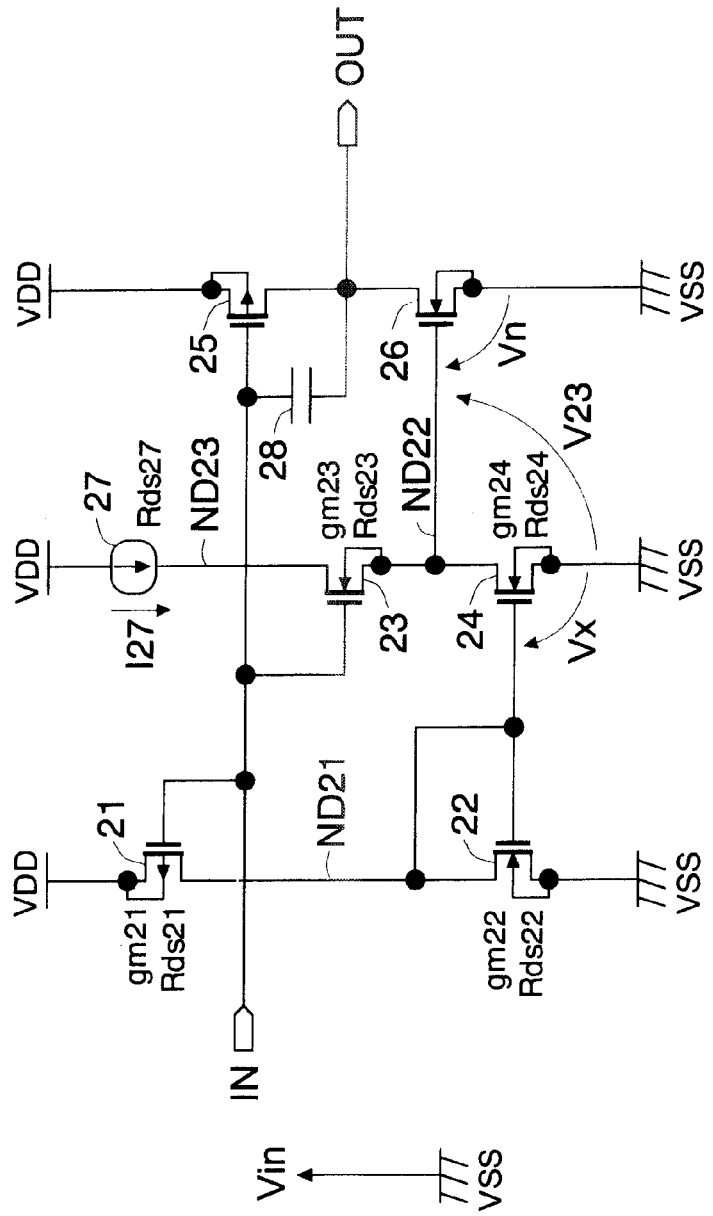
FIG. 1 is a circuit diagram showing a conventional push-pull amplifier.
Figure 2:
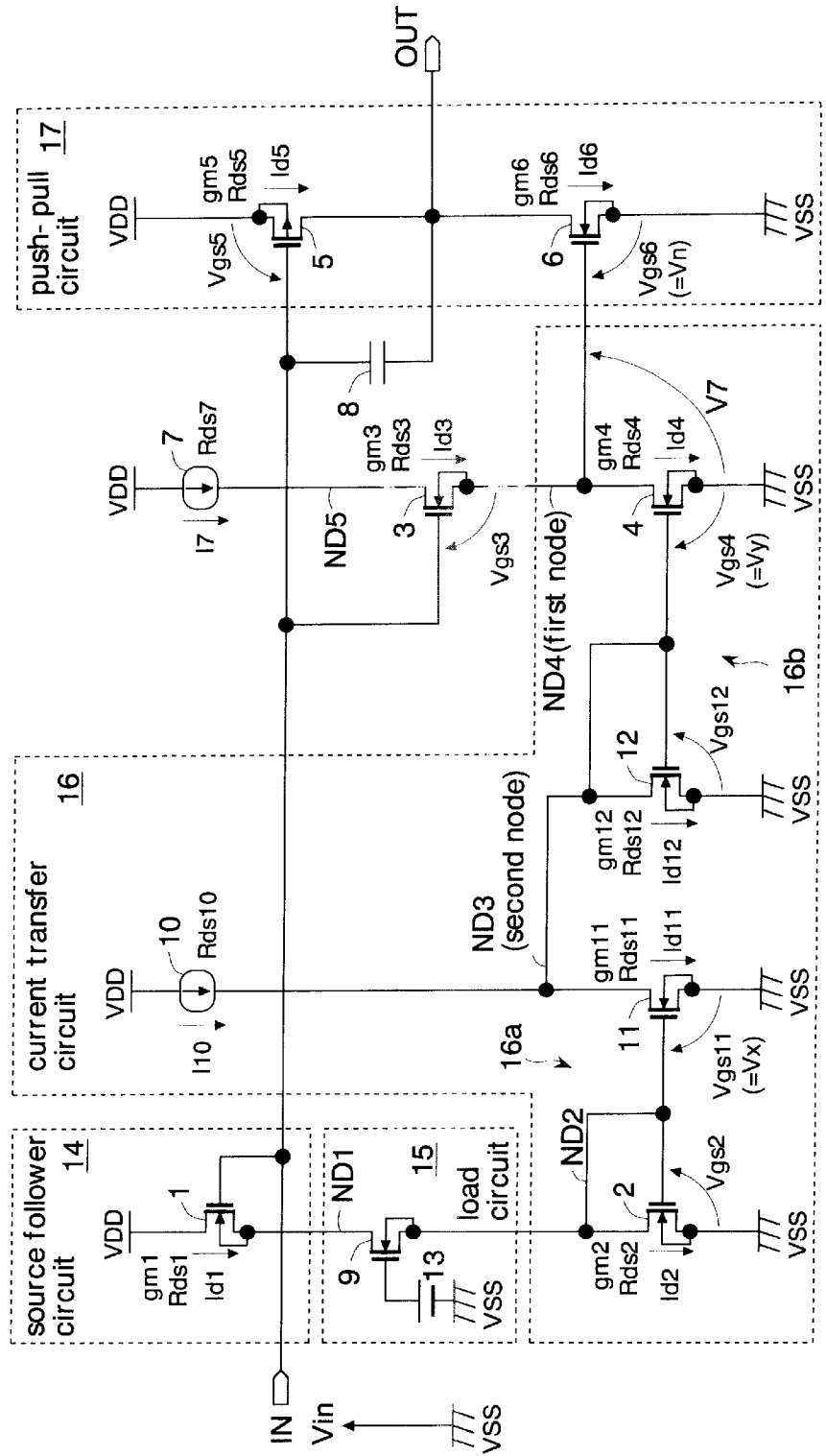
FIG. 2 is a circuit diagram showing an embodiment of a push-pull amplifier according to the present invention.

FIG. 2 shows one embodiment of a push-pull amplifier according to the present invention. The push-pull amplifier includes n-channel MOSFETs 1, 2, 3, 4, 6, 9, 11, and 12 (which will be referred to simply as nMOSes 1, 2, 3, 4, 6, 9, 11, and 12 hereinafter); a p-channel MOSFET 5 (which will be referred to simply as pMOS 5 hereinafter); a constant-current sources 7 and 10; a phase compensation capacitor 8; a constant-voltage source 13; an input terminal IN for receiving an input signal Vin; and an output terminal OUT for outputting an output signal. The input signal Vin is directly supplied to the pMOS 5 and the nMOS 3.

In the present embodiment, the nMOS1 constitutes a source follower circuit 14. The nMOS 9 (a load transistor) and the constant-voltage source 13 constitute a load circuit 15. The nMOSes 2, 11, 12, and 4 and the constant-current source 10 constitute a current transfer circuit 16. The current transfer circuit 16 includes a first current mirror circuit 16a composed of the nMOS 2 (a first input transistor) and nMOS 11 (a first output transistor), and further includes a second current mirror circuit 16b composed of the nMOS 12 (a second input transistor) and nMOS 4 (a second output transistor). The pMOS 5 (a first transistor) and nMOS 6 (a second transistor) constitute a push-pull circuit 17 (the output stage).

The nMOS 1 has its gate, source and drain electrodes connected to the input terminal IN, a node ND1 and a power supply line VDD, respectively. The gate electrode, source electrode and drain electrode will be referred to simply as gate, source and drain, respectively, hereinafter. The nMOS 9 has its gate, source and drain connected to the constant-voltage source 13, a node ND2 and the node ND1, respectively. The nMOS 2 has its gate and drain both connected to the node ND2, and has its source connected to a ground line VSS. The nMOS 11 has its gate, source and drain connected to the node ND2, the ground line VSS and a node ND3, respectively. The nMOS 12 has its gate and drain both connected to the node ND3, and has its source connected to the ground line VSS.

The nMOS 4 has its gate, source and drain connected to the node ND3, the ground line VSS and a node ND4, respectively. The nMOS 3 has its gate, source and drain connected to the input terminal IN, the node ND4 and a node ND5, respectively. The pMOS 5 has its gate, source and drain connected to the input terminal IN, a power supply line VDD and the output terminal OUT, respectively. The nMOS 6 has its gate, source and drain connected to the node ND4, the ground line VSS and the output terminal OUT, respectively.

The constant-current source 10 supplies a constant current 110 to the node ND3. The constant-current source 7 supplies a constant current 17 to the node ND5. The capacitor 8 is inserted between the input terminal IN and the output terminal OUT.

The push-pull amplifier described above operates as described below.

When the input voltage Vin increases, the gate-to-source voltage Vgs5 of the pMOS 5 decreases, so that a current Id5 flowing through the pMOS 5 decreases. Since the gate-to-source voltage of the nMOS 1 increases, a current Id1 input current) flowing through the nMOS 1 increases. A current Id2, which is identical to the input current Id1, flows through the nMOS 2 of the first current mirror circuit 16a, while a current Id11 (a first output current), which is identical to the current Id2, flows through the nMOS 11. That is, the current Id11 flowing through the nMOS 11 also increases.

Since the gate of the nMOS 9 is being supplied with a constant voltage, the gate-to-source voltage of the nMOS 9 is constant, and the nMOS 9 always operates in the saturation region. This nMOS 9 can prevent any variation in the power supply voltage VDD from affecting the first current mirror circuit 16a.

Both the drain of the nMOS 11 of the first current mirror circuit 16a and the drain of the nMOS 12 of the second current mirror circuit 16b are connected to the node ND3 (the second node). Thus, the sum of the current Id11 flowing through the nMOS 11 and a current Id12 (a second input current) flowing through the nMOS 12 is maintained at a constant value (=110) by the constant-current source 10. Therefore, as the current Id11 becomes greater, the current Id12 becomes smaller. As the current Id12 becomes smaller, then a current Id4 (a second output current) flowing through the nMOS 4 of the second current mirror circuit 16b also becomes smaller. In this way, parallel connection of the two current mirror circuits 16a and 16b can easily configure the current transfer circuit 16 whose input (Id1, Id2) and output (Id4) currents sum to the constant value.

When the input voltage Vin increases, the gate-to-source voltage of the nMOS 3 increases. A current Id3 flowing through the nMOS 3, therefore, increases. The decrease in the current Id4 and the increase in the current Id3 lead to an increase in the voltage at the node ND4 (the first node), that is, the gate-to-source voltage Vgs6 of the nMOS 6 (=Vn), resulting in an increase in a current Id6 flowing through the nMOS 6 that is the output stage of the push-pull amplifier.

When the input voltage Vin decreases, the foregoing transistors operate oppositely to the above. Consequently, the current Id5 flowing through the pMOS 5 increases, while the current Id6 flowing through the nMOS 6 decreases. In this way, the push-pull operation is performed.

The voltage gain dVn/dVin of the gate voltage Vn of the nMOS 6 to the input signal Vin will be obtained below. It is now assumed here that the transfer conductance, drain-to-source resistance and drain current of the nMOS 1 are gm1, Rds1, and Id1, respectively; the transfer conductance, drain-to-source resistance and drain current of the nMOS 2 are gm2, Rds2, and Id2, respectively; the transfer conductance, drain-to-source resistance and drain current of the nMOS 11 are gm11, Rds11, and Id11, respectively; the transfer conductance, drain-to-source resistance and drain current of the nMOS 12 are gm12, Rds12, and Id12, respectively; the transfer conductance, drain-to-source resistance and drain current of the nMOS 3 are gm3, Rds3, and Id3, respectively; the transfer conductance, drain-to-source resistance and drain current of the nMOS 4 are gm4, Rds4, and Id4, respectively; the transfer conductance, drain-to-source resistance and drain current of the nMOS 6 are gm6, Rds6, and Id6, respectively; and that the transfer conductance, drain-to-source resistance and drain current of the pMOS 5 are gm5, Rds5, and Id5, respectively.

It is also assumed here that the voltage between the drain of the nMOS 2 and the ground (the voltage at the node ND2) is Vgs2; the gate-to-source voltage of the nMOS 11 is Vgs 11 (=Vx); the gate-to-source voltage of the nMOS 12 is Vgs12; the gate-to-source voltage of the nMOS 3 is Vgs3; the gate-to-source voltage of the nMOS 4 is Vgs4 (=Vy); the voltage between the drain of the nMOS 4 and the ground is V7; the gate-to-source voltage of the nMOS 6 is Vgs6 (=Vn); the gate-to-source voltage of the pMOS 5 is Vgs5; and that the internal resistances of the constant-current sources 10 and 7 are Rds 10 and Rds7, respectively.

The above parameters can be used to provide the following equations (7), (8), (9), and (10).

$$gm1(Vin - Vx) + \frac{VDD - Vx}{Rds1} = gm2 \cdot Vx + \frac{Vx}{Rds2} \quad (7)$$

$$I10 + \frac{VDD - Vy}{Rds10} = gm11 \cdot Vx + \frac{Vy}{Rds11} + gm12 \cdot Vy + \frac{Vy}{Rds12} \quad (8)$$

$$I7 + \frac{VDD - V7}{Rds7} = gm3(Vin - Vn) + \frac{V7 - Vn}{Rds3} \quad (9)$$

$$I7 + \frac{VDD - V7}{Rds7} = gm4 \cdot Vy + \frac{Vn}{Rds4} \quad (10)$$

From the above equations (7) through (10), the voltage gain dVn/dVin of the gate voltage Vn of the nMOS 6 to the input signal Vin can be expressed by the following equation (11).

$$\frac{dVn}{dVin} = \frac{gm3 \cdot \left(gm12 + \frac{1}{Rds10} + \frac{1}{Rds11} + \frac{1}{Rds12}\right) + 2 \cdot gm4 \cdot gm11 \cdot \left(\dfrac{gm1}{gm1 + gm2 + \frac{1}{Rds1} + \frac{1}{Rds2}}\right)}{\left(\frac{2}{Rds4} + \frac{1}{Rds3} + gm3\right) \cdot \left(gm12 + \frac{1}{Rds10} + \frac{1}{Rds11} + \frac{1}{Rds12}\right)}$$

$$= \frac{gm3(gm12 \cdot Rds10 \cdot Rds11 \cdot Rds12 + Rds10 + Rds11 + Rds12) \cdot [(gm1 + gm2) \cdot Rds1 \cdot Rds2 + Rds1 + Rds2] \cdot Rds3 \cdot Rds1}{(2Rds3 + Rds4 + gm3 \cdot Rds3 \cdot Rds4) \cdot (gm12 \cdot Rds10 \cdot Rds11 \cdot Rds12 + Rds10 + Rds11 + Rds12) \cdot [(gm1 + gm2) \cdot Rds1 \cdot Rds2 + Rds1 + Rds2]} +$$

$$\frac{2gm4 \cdot gm11 \cdot gm1 \cdot Rds1 \cdot Rds2 \cdot Rds3 \cdot Rds4 \cdot Rds10 \cdot Rds11 \cdot Rds12}{(2Rds3 + Rds4 + gm3 \cdot Rds3 \cdot Rds4) \cdot (gm12 \cdot Rds10 \cdot Rds11 \cdot Rds12 + Rds10 + Rds11 + Rds12) \cdot [(gm1 + gm2) \cdot Rds1 \cdot Rds2 + Rds1 + Rds2]}$$

(11)

Since gm·Rds is, in general, much greater than 1 (i.e., gm·Rds>>1), the equation (11) can be approximated to get the following equation (12).

$$\frac{dVn}{dVin} = 2 \frac{gm1 \cdot gm4 \cdot gm11}{gm12 \cdot gm3 \cdot (gm1 + gm2)} + 1 \quad (12)$$

Moreover, when gm2 and gm11 of the nMOSes 2 and 11, respectively, constituting the first current mirror circuit 16a are equal to each other and when gm12 and gm4 of the nMOSes 12 and 4, respectively, constituting the second current mirror circuit 16b are equal to each other, the voltage gain dVn/dVin can be obtained by the following equation (13).

$$\frac{dVn}{dVin} = 2 \frac{gm1 \cdot gm2}{gm3 \cdot (gm1 + gm2)} + 1 \quad (13)$$

In the above equation (13), gm1 and gm2 are in a parallel relationship. Thus, gm1·gm2/(gm1+gm2) is a value that is smaller than gm 1. If it is assumed that gm 1 is equal to gm2, then the following equation (14) can be obtained.

$$\frac{dVn}{dVin} = \frac{gm1}{gm3} + 1 \quad (14)$$

As evident from the above equation (14), the voltage gain dVn/dVin of the gate voltage Vn of the nMOS 6 to the input signal Vin is half the conventional value (the equation (6)). That is, the difference in input voltage gain between the pMOS 5 and nMOS 6 of the push-pull circuit 17 with respect to the input signal Vin is reduced.

In the present embodiment described above, since there is formed the source follower circuit that receives at its gate the input signal and outputs the input current that is in accordance with the input signal, it is possible to reduce the gain of the gate voltage of the nMOS 6 of the push-pull circuit 17 to the input signal. Since the difference between the gain of the gate voltage of the pMOS 5 and that of the gate voltage of the nMOS 6 in the push-pull circuit 17 to the input signal can be reduced, it is possible to easily design a push-pull amplifier with a stable operation.

In a case when the push-pull amplifier is used in the output stage of an operational amplifier, it is possible to reduce the gain of a circuit that transfers the output of a differential amplifier of the operational amplifier to the output stage thereof. For this reason, the capacitance value of the phase compensation capacitor 8 can be reduced. As a result, the layout area (chip area) of the push-pull amplifier and that of the operational amplifier can be reduced, resulting in a reduction in manufacturing cost. In addition, since the gain in the high frequency range is raised, it is possible to provide amplification in a wider frequency band.

Since the current transfer circuit 16 is configured with the first and second current mirror circuits 16a and 16b connected in parallel, it is possible to easily provide the current transfer circuit 16 whose input (Id1=Id2) and output (Id4) currents sum to a constant value.

The nMOS 9 having its gate connected to the constant-voltage source 13 was formed between the output of the source follower circuit 14 (the node ND1) and the input of the current transfer circuit 16 (the node ND2). For this reason, even when the power supply voltage VDD to be supplied to the source follower circuit 14 varies, it is possible to prevent such a variation from affecting the first current mirror circuit 16a.

The invention is not limited to the above embodiments and various modifications may be made without departing from the spirit and scope of the invention. Any improvement may be made in part or all of the components.

What is claimed is:

1. A push-pull amplifier comprising:

a source follower circuit that receives an input signal at its gate, and outputs an input current that corresponds to said input signal;

a current transfer circuit that receives said input current and maintains constant the sum of said input current and an output current that is to be applied to a first node; and a push-pull circuit including a first transistor that directly receives said input signal at its gate, and a second transistor having its gate connected to said first node, wherein said current transfer circuit includes a first current mirror circuit including a first input transistor whose drain and gate are supplied with said input current, and a first output transistor that has its drain connected to a second node and that generates a first output current with the same value as said input current, a second current mirror circuit including a second input transistor that has its drain and gate connected to said second node and that generates a second input current, and a second output transistor that has its drain connected to said first node and that supplies said first node with said output current with the same value as said second input current, and a constant-current source supplying a constant current to said second node.

2. A push-pull amplifier comprising:

a source follower circuit that receives an input signal at its gate, and outputs an input current that corresponds to said input signal;

a current transfer circuit that receives said input current and maintains constant the sum of said input current and an output current that is to be applied to a first node; and a push-pull circuit including a first transistor that directly receives said input signal at its gate, and a second transistor having its gate connected to said first node; and a load transistor that is disposed between the output of said source follower circuit and the input of said current transfer circuit and that has its gate connected to a constant-voltage source.

* * * * *